United States Patent
Takase

(10) Patent No.: US 11,473,980 B2
(45) Date of Patent: Oct. 18, 2022

(54) METHOD FOR MEASURING HEAT GENERATION DISTRIBUTION IN HONEYCOMB STRUCTURE, SYSTEM FOR MEASURING HEAT GENERATION DISTRIBUTION IN HONEYCOMB STRUCTURE, METHOD FOR PRODUCING HONEYCOMB STRUCTURE, AND METHOD FOR PRODUCING ELECTRIC HEATING TYPE SUPPORT

(71) Applicant: NGK INSULATORS, LTD., Nagoya (JP)

(72) Inventor: Naoya Takase, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 274 days.

(21) Appl. No.: 16/797,320

(22) Filed: Feb. 21, 2020

(65) Prior Publication Data

US 2020/0300712 A1  Sep. 24, 2020

(30) Foreign Application Priority Data

Mar. 20, 2019 (JP) .............................. JP2019-053788

(51) Int. Cl.
  *G01K 7/16* (2006.01)
  *F01N 11/00* (2006.01)
  *G01R 19/00* (2006.01)

(52) U.S. Cl.
  CPC .............. *G01K 7/16* (2013.01); *F01N 11/005* (2013.01); *G01R 19/0023* (2013.01)

(58) Field of Classification Search
  CPC combination set(s) only.
  See application file for complete search history.

(56) References Cited

U.S. PATENT DOCUMENTS

| 5,554,342 A | 9/1996 | Hirayama et al. |
| 9,347,353 B2 * | 5/2016 | Yoshioka ............... G01N 27/14 |

(Continued)

FOREIGN PATENT DOCUMENTS

| JP | H05-179939 A1 | 7/1993 |
| JP | 2014-051402 A1 | 3/2014 |

*Primary Examiner* — Binh Q Tran
(74) *Attorney, Agent, or Firm* — Burr & Brown, PLLC

(57) ABSTRACT

A method for measuring a heat generation distribution in a honeycomb structure includes: applying a voltage to a pair of electrode layers of the honeycomb structure to bring the honeycomb structure to an electrically conductive state; measuring resistance values $R_n$ between two different points on the surface of an outer peripheral wall of the honeycomb structure; estimating a current value $I_n$ flowing between the two points using Kirchhoff's law based on each of the resistance values $R_n$ between the two different points, and calculating a heat value generated for each of the resistance values $R_n$ based on each of the resistance values $R_n$ and the current value $I_n$; and estimating a heat generation distribution in the honeycomb structure based on both the positions at which each of the resistance values $R_n$ is measured, and the heat value calculated from each of the resistance values $R_n$, in the honeycomb structure.

11 Claims, 7 Drawing Sheets

(56) References Cited

U.S. PATENT DOCUMENTS

| | | | |
|---|---|---|---|
| 2011/0268613 A1* | 11/2011 | Hirai | F01N 11/005 422/108 |
| 2011/0305601 A1* | 12/2011 | Kawase | F01N 3/2026 422/109 |
| 2012/0076698 A1* | 3/2012 | Ishihara | B01J 35/0033 422/174 |
| 2014/0037511 A1* | 2/2014 | Hashimoto | B01J 35/04 422/174 |
| 2015/0218995 A1* | 8/2015 | Hashimoto | F01N 3/20 60/286 |

* cited by examiner

METHOD FOR MEASURING HEAT GENERATION DISTRIBUTION IN HONEYCOMB STRUCTURE, SYSTEM FOR MEASURING HEAT GENERATION DISTRIBUTION IN HONEYCOMB STRUCTURE, METHOD FOR PRODUCING HONEYCOMB STRUCTURE, AND METHOD FOR PRODUCING ELECTRIC HEATING TYPE SUPPORT

FIELD OF THE INVENTION

The present invention relates to a method for measuring heat generation distribution in a honeycomb structure, a system for measuring heat generation distribution in a honeycomb structure, a method for producing a honeycomb structure, and a method for producing an electric heating type support. More particularly, the present invention relates to a method for measuring heat generation distribution in a honeycomb structure, a system for measuring heat generation distribution in a honeycomb structure, a method for producing a honeycomb structure, and method for producing electric heating type support, which can improve a measurement efficiency of the heat generation distribution in the honeycomb structure and enable stable and accurate evaluation.

Conventionally, a catalyst supported on a pillar shaped honeycomb structure having a plurality of partition walls that define a plurality of cells penetrating from one end face to other end face to form flow paths is used in order to purify harmful substances such as HC, CO, and $NO_x$ contained in an exhaust gas discharged from an engine of a motor vehicle or the like. Thus, when treating the exhaust gas with the catalyst supported on the honeycomb structure, it is necessary to raise the temperature of the catalyst to its activation temperature. However, at the time of starting of the engine, the catalyst does not reach the activation temperature. Therefore, there is a problem that the exhaust gas is not sufficiently purified. In particular, a plug-in hybrid vehicle (PHEV) or a hybrid vehicle (HV) includes traveling only with a motor in the travel motion, so that it has less engine start frequency and also a decreased catalyst temperature at the time of starting of the engine, which will tend to deteriorate exhaust gas purification performance.

To solve the problem, an electric heating catalyst (EHC) has been proposed, in which a pair of terminals are connected to a pillar shaped honeycomb structure made of conductive ceramics, and the honeycomb structure itself is heated by electric conduction, so that the temperature of the catalyst can be raised to its activation temperature before starting of the engine. The EHC is desired to reduce temperature unevenness in the honeycomb structure to have a uniform temperature distribution, in order to obtain a sufficient catalytic effect.

As a performance evaluation for a honeycomb structure, a temperature distribution in the honeycomb structure when causing the honeycomb structure to generate heat is examined. As a method of generating heat in a honeycomb structure, it is known that heat is generated by applying a voltage to a honeycomb structure through an electric conduction path in a form of series circuit, as disclosed in Patent Document 1. Further, as disclosed in Patent Document 2, it is known that heat is generated by providing electrodes to a honeycomb structure, and applying a voltage to the honeycomb structure through an electric conduction path in a form of parallel circuit.

CITATION LIST

Patent Literatures

Patent Document 1: Japanese Patent Application Publication No. 05-179939 A
Patent Document 2: Japanese Patent Application Publication No. 2014-51402 A

SUMMARY OF THE INVENTION

In the method for generating heat in the honeycomb structure as disclosed in Patent Document 1, a uniform current flows at any position of the honeycomb structure because the electric conduction path is in the form of series circuit. Therefore, the heat generation pattern becomes uniform over the entire honeycomb structure.

However, in the method for generating heat in the honeycomb structure as disclosed in Patent Document 2, the electrodes are arranged in the honeycomb structure and the electric conduction path is in the form of parallel circuit, so the heat generation pattern varies depending on the resistance distribution inside the honeycomb structure and the resistance distribution inside the electrodes. Therefore, in order to confirm the performance of the honeycomb structure, it is necessary to actually generate heat and confirm the temperature distribution by thermography or to confirm the purification performance by allowing an exhaust gas to flow through the honeycomb structure.

As described above, conventionally when evaluating the heat generation distribution in the honeycomb structure in which the electrodes are arranged and the electric conduction path is in the form of parallel circuit, it is necessary to actually generate heat in the honeycomb structure, and there is a need for improvement of measurement efficiency. Further, the method for evaluating the heat generation distribution in the honeycomb structure by confirming the temperature distribution with thermography partially relies on human senses, and it is thus difficult to carry out any stable and accurate evaluation.

The present invention has been made in view of the above circumstances. An object of the present invention is to provide a method for measuring heat generation distribution in a honeycomb structure, a system for measuring heat generation distribution in a honeycomb structure, a method for producing a honeycomb structure, and method for producing electric heating type support, which can improve measurement efficiency for the heat generation distribution in the honeycomb structure and are enable stable and accurate evaluation.

As a result of intensive studies, the present inventors have found that the above problems can be solved by measuring resistance values between two different points at a plurality of positions on a surface of the honeycomb structure in which the electrodes are arranged to measure a resistance distribution inside the honeycomb structure, and estimating a heat generation pattern based on the measured resistance distribution. Thus, the present invention is specified as follows:

(1)

A method for measuring a heat generation distribution in a honeycomb structure, the honeycomb structure comprising:

a pillar shaped honeycomb structure portion comprising: an outer peripheral wall; and porous partition walls disposed on an inner side of the outer peripheral wall, the porous partition walls defining a plurality of cells, each cell penetrating from one end face to other end face to form a flow path; and a pair of electrode layers disposed on a surface of the outer peripheral wall of the pillar shaped honeycomb structure portion so as to face each other across a central axis of the pillar shaped honeycomb structure portion, the method comprising the steps of:

applying a voltage to the pair of electrode layers to bring the honeycomb structure to an electrically conductive state;

measuring resistance values $R_n$ between two different points at a plurality of positions on the surface of the outer peripheral wall of the pillar shaped honeycomb structure in the electrically conductive state;

estimating a current value $I_n$ flowing between the two points using Kirchhoff's law based on each of the resistance values $R_n$ between the two different points measured at the plurality of positions, and calculating a heat value generated for each of the resistance values $R_n$ based on each of the resistance values $R_n$ and the current value $I_n$; and estimating a heat generation distribution in the honeycomb structure based on both the positions at which each of the resistance values $R_n$ is measured, and the heat value calculated from each of the resistance values $R_n$, in the honeycomb structure.

(2)

A system for measuring a heat generation distribution in a honeycomb structure, the honeycomb structure comprising:

a pillar shaped honeycomb structure portion comprising: an outer peripheral wall; and porous partition walls disposed on an inner side of the outer peripheral wall, the porous partition walls defining a plurality of cells, each cell penetrating from one end face to other end face to form a flow path; and a pair of electrode layers disposed on a surface of the outer peripheral wall of the pillar shaped honeycomb structure portion so as to face each other across a central axis of the pillar shaped honeycomb structure portion, the system comprising:

a power supply unit for applying a voltage to the pair of electrode layers to bring the honeycomb structure to an electrically conductive state;

a resistance measurement unit for measuring resistance values $R_n$ between two different points at a plurality of positions on the surface of the outer peripheral wall of the pillar shaped honeycomb structure in the electrically conductive state;

a heat value calculation unit for estimating a current value $I_n$ flowing between the two points using Kirchhoff's law based on each of the resistance values $R_n$ between the two different points measured at the plurality of positions, and calculating a heat value generated for each of the resistance values $R_n$ based on each of the resistance values $R_n$ and the current value $I_n$; and a heat generation distribution estimation unit for estimating a heat generation distribution in the honeycomb structure based on both the positions at which each of the resistance values $R_n$ is measured, and the heat value calculated from each of the resistance values $R_n$, in the honeycomb structure.

(3)

A method for producing a honeycomb structure, the method comprising the steps of:

measuring a heat generation distribution in the honeycomb structure by the method for measuring the heat generation distribution in the honeycomb structure according to (1); and evaluating the heat generation distribution in the honeycomb structure and selecting a passed product.

(4)

A method for producing an electric heating type support, the method comprising the steps of:

measuring a heat generation distribution in the honeycomb structure by the method for measuring the heat generation distribution in the honeycomb structure according to (1);

evaluating the heat generation distribution of the honeycomb structure and selecting a passed product; and providing a pair of metal terminals on the pair of electrode layers to the selected honeycomb structure.

According to the present invention, it is possible to provide a method for measuring heat generation distribution in a honeycomb structure, a system for measuring heat generation distribution in a honeycomb structure, a method for producing a honeycomb structure, and method for producing electric heating type support, which can improve measurement efficiency for the heat generation distribution in the honeycomb structure and are enable stable and accurate evaluation.

DETAILED DESCRIPTION OF THE INVENTION

Hereinafter, embodiments according to the present invention will be specifically described with reference to the drawings. It is to understand that the present invention is not limited to the following embodiments, and various design modifications and improvements may be made based on ordinary knowledge of a person skilled in the art, without departing from the spirit of the present invention.

<Method for Measuring Heat Generation Distribution in Honeycomb Structure>

(1. Honeycomb Structure)

Figure 1:
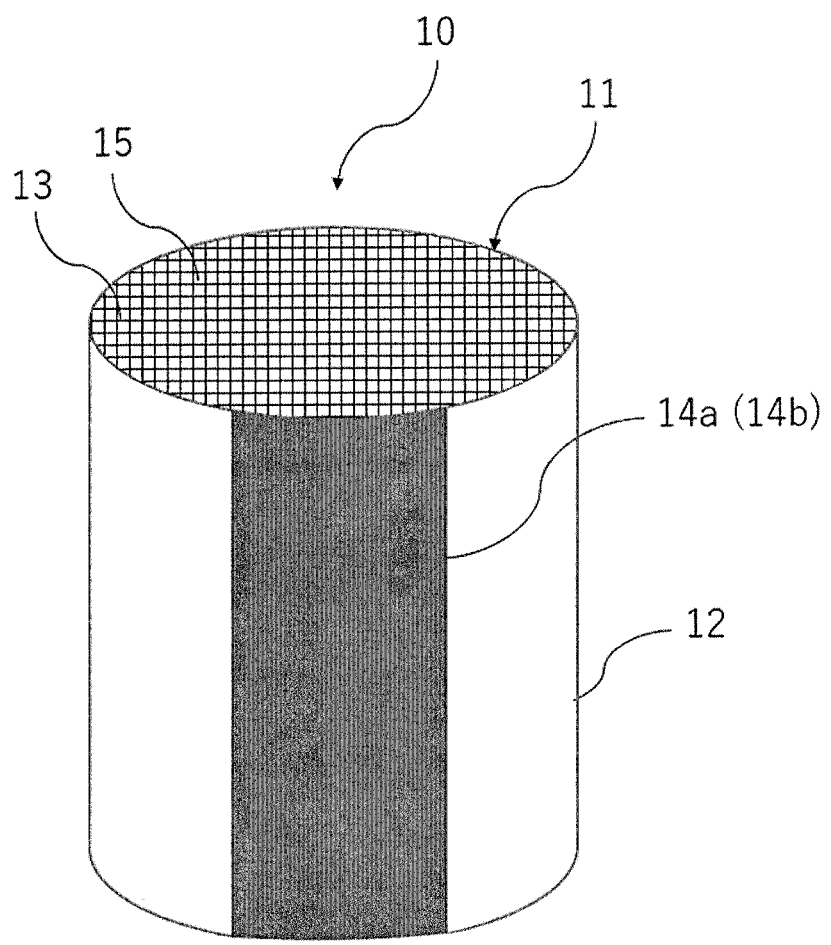
FIG. 1 is a schematic external view of a honeycomb structure to be measured for a heat generation distribution by a method for measuring heat generation distribution according to an embodiment of the present invention.
Figure 2:
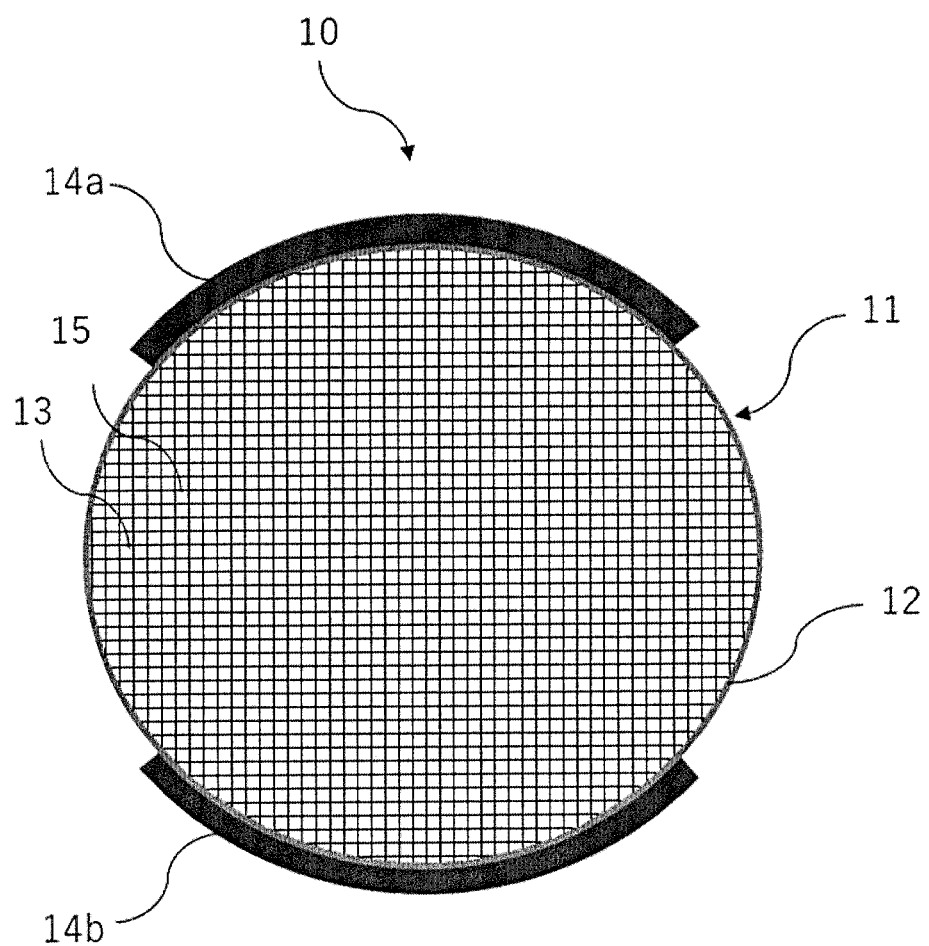
FIG. 2 is a schematic cross-sectional view of a honeycomb structure according to an embodiment of the present invention, which is perpendicular to a cell extending direction.

FIG. 1 is a schematic external view of a honeycomb structure 10 to be measured for a heat generation distribution by a method for measuring a heat generation distribution according to an embodiment of the present invention, and FIG. 2 is a schematic cross-sectional view of the honeycomb structure 10, which is perpendicular to an extending direction of cells 15.

The honeycomb structure 10 is provided with a pillar shaped honeycomb structure portion 11 including: an outer peripheral wall 12; and porous partition walls 13 which are disposed on an inner side of the outer peripheral wall 12 and define a plurality of cells 15 penetrating from one end face to other end face to form flow paths.

An outer shape of the pillar shaped honeycomb structure portion 11 is not particularly limited as long as it is pillar shaped. For example, the honeycomb structure portion can have a shape such as a pillar shape with circular end faces (circular pillar shape) and a pillar shape with polygonal (square, pentagonal, hexagonal, heptagonal, octagonal, etc.) end faces. The pillar shaped honeycomb structure portion 11 may have an area of each end face of from 2000 to 20000 $mm^2$, for example, although not particularly limited thereto.

The pillar shaped honeycomb structure portion 11 is made of conductive ceramics. Electrical resistivity of the ceramic is not particularly limited as long as the honeycomb structure 10 can generate heat by Joule heat upon electrical conduction. The pillar shaped honeycomb structure may have an electrical resistivity of from 1 to 200 Ωcm. In the present invention, the electrical resistivity of the pillar shaped honeycomb structure portion 11 is a value measured at 400° C. by a four-terminal method.

Examples of the ceramics forming the pillar shaped honeycomb structure portion 11 include, but not limited to, oxide ceramics such as alumina, mullite, zirconia, and cordierite, and non-oxide ceramics such as silicon carbide, silicon nitride, and aluminum nitride. Further, a silicon carbide-metallic silicon composite material, a silicon carbide/graphite composite material, or the like can also be used.

A shape of each cell in a cross section perpendicular to an extending direction of the cells 15 is not limited, but it may preferably be a square, a hexagon, an octagon, or a combination thereof.

Each of the partition walls 13 forming the cells 15 preferably may have a thickness of from 0.1 to 0.3 mm, although not limited thereto. In the present invention, the thickness of the partition wall 13 is defined as a length of a portion passing through the partition wall 13, among line segments connecting centers of gravity of the adjacent cells 15 in a cross section perpendicular to the extending direction of the cells 15.

The honeycomb structure 10 may have a cell density of from 40 to 150 cells/$cm^2$. The cell density is a value obtained by dividing the number of cells by an area of one end face of the pillar shaped honeycomb structure portion 11 excluding the outer peripheral wall 12.

The outer peripheral wall 12 of the honeycomb structure 10 may have a thickness of from 0.1 mm to 1.0 mm or less, although not limited thereto. As used herein, the thickness of the outer peripheral wall 12 is defined as a thickness of the outer peripheral wall 12 in a direction of a normal line to a tangential line at a measurement point when observing a portion of the outer peripheral wall 12 to be subjected to thickness measurement in a cross section perpendicular to a cell extending direction.

The partition walls 13 can be porous. A porosity of the partition wall 13 may be from 35 to 60%, although not limited thereto. The porosity is a value measured by a mercury porosimeter.

The partition walls 13 of the pillar shaped honeycomb structure portion 11 may have an average pore diameter of from 2 to 15 μm, although not limited thereto. The average pore diameter is a value measured by a mercury porosimeter.

The honeycomb structure 10 includes a pair of electrode layers 14a, 14b made of conductive ceramics, which are disposed on the surface of the outer peripheral wall 12 of the pillar shaped honeycomb structure portion 11, so as to face each other across a center axis of the pillar shape honeycomb structure portion 11. The pair of electrode layers 14a and 14b are provided such that one electrode layer 14a faces other electrode layer 14b across a central axis of the pillar shaped honeycomb structure portion 11.

The electrode layers 14a, 14b may be formed in a non-limiting region. In terms of enhancing uniform heat generation of the pillar shaped honeycomb structure portion 11, each of the electrode layers 14a, 14b may be provided so as to extend in a form of belt in the circumferential direction and the cell extending direction. More particularly, each of the electrode layers 14a, 14b may extend over a length of 80% or more between both end faces of the pillar shaped honeycomb structure portion 11.

Each of the electrode layers 14a, 14b may have a thickness of from 0.01 to 5 mm, although not limited thereto. The thickness of each of the electrode layers 14a, 14b is defined as a thickness in a direction of a normal line to a tangential line at a measurement point on an outer surface of each of the electrode layers 14a, 14b when observing the point of each electrode layer to be subjected to thickness measurement in a cross section perpendicular to the cell extending direction.

The electric resistivity of each of the electrode layers 14a, 14b is lower than the electric resistivity of the pillar shaped honeycomb structure portion 11, whereby the electricity tends to flow preferentially to the electrode layers, and the electricity tends to spread in the cell flow path direction and the circumferential direction during electric conduction. The electric resistivity of the electrode layers 14a, 14b may be $\frac{1}{10}$ or less, although not limited thereto. In the present invention, the electric resistivity of the electrode layers 14a, 14b is a value measured at 400° C. by a four-terminal method.

Each of the electrode layers 14a, 14b may be made of a metal and a conductive ceramic. Examples of the metal include a single metal of Cr, Fe, Co, Ni, Si or Ti, or an alloy containing at least one metal selected from the group consisting of those metals. Non-limiting examples of the conductive ceramic include silicon carbide (SiC), metal compounds such as metal silicides such as tantalum silicide ($TaSi_2$) and chromium silicide ($CrSi_2$), and further a composite material (cermet) comprised of a combination of one or more of the conductive ceramics and one or more of the above metals. Specific examples of the cermet include a composite material of metallic silicon and silicon carbide, a composite material of metallic silicide such as tantalum silicide and chromium silicide, metallic silicon and silicon carbide, and further a composite material containing, in addition to one or more metals listed above, one or more insulating ceramics such as alumina, mullite, zirconia, cordierite, silicon nitride, and aluminum nitride, in terms of decreased thermal expansion. Among the various metals and conductive ceramics as described above, the material of the electrode layers 14a, 14 may be, for example, a combination of a metal silicide such as tantalum silicide and chromium silicide with a composite material of metallic silicon and silicon carbide.

(2. Method for Measuring Heat Generation Distribution in Honeycomb Structure)

A method for measuring a heat generation distribution in the honeycomb structure according to an embodiment of the present invention will be now described in detail. First, a voltage is applied to a pair of electrode layers 14a, 14b of the honeycomb structure 10 to bring the honeycomb structure 10 to an electrically conductive state. The honeycomb structure 10 is provided with the pair of electrode layers 14a, 14b, and has an electric conduction path in a form of parallel circuit. Although depending on the size and the material of the honeycomb structure 10, the heat generation distribution in the honeycomb structure 10 can be measured by allowing a constant current in a range of from 0.01 to 1.0 A to flow through the honeycomb structure 10.

Figure 3:
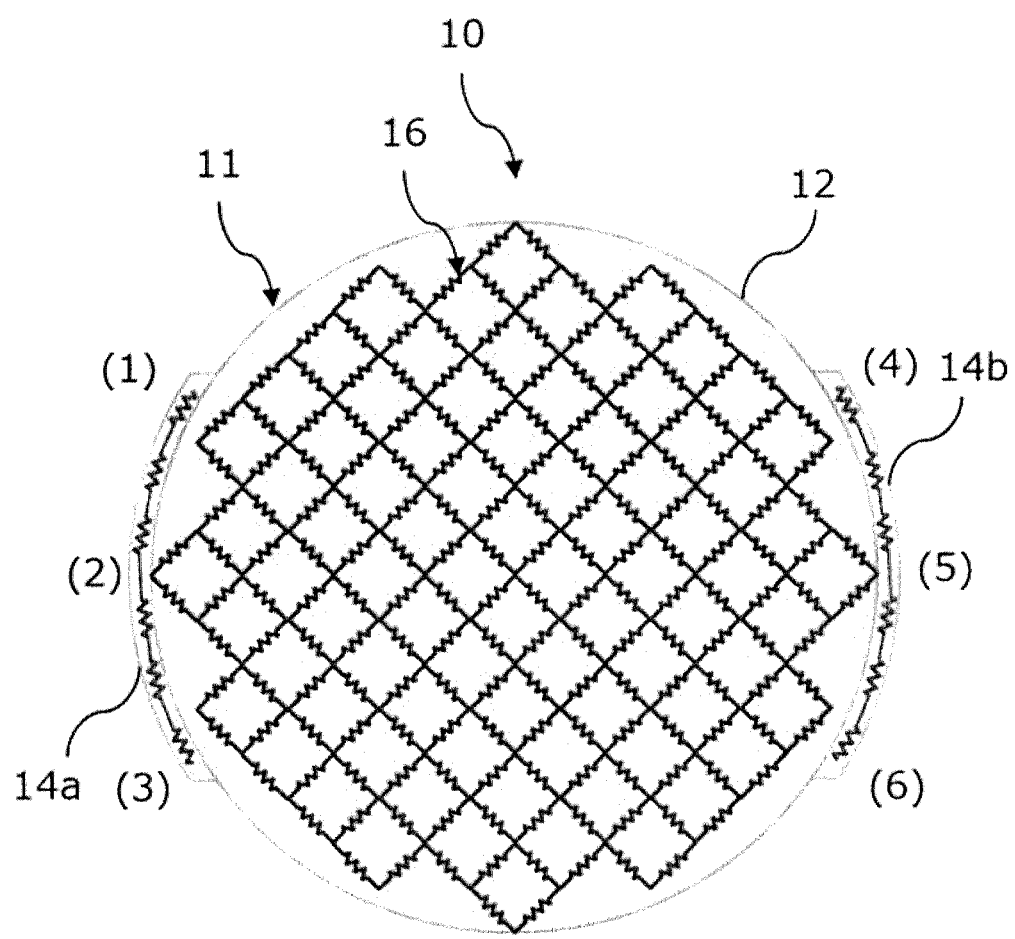
FIG. 3 is a schematic view illustrating an example of a resistance circuit drawn on a cross section perpendicular to a cell extending direction of a honeycomb structure according to an embodiment of the present invention.

Subsequently, on the surface of the outer peripheral wall 12 of the pillar shaped honeycomb structure portion 11 in the electrically conductive state, resistance values $R_n$ between two different points are measured at a plurality of positions. FIG. 3 is a schematic view illustrating an example of a resistance circuit 16 drawn on a cross section of the honeycomb structure 10, which is perpendicular to the extending direction of the cells 15. In the method for measuring the heat generation distribution in the honeycomb structure according to the embodiment of the present invention, it is considered that the resistance distribution inside the honeycomb structure 10 forms a resistance circuit 16 as shown in FIG. 3. In the resistance circuit 16 as shown in FIG. 3, the resistance values $R_n$ between two different points on the surface of the outer peripheral wall 12 of the pillar shaped honeycomb structure 11 are measured at a plurality of points, thereby assuming a simplified resistance circuit as shown in FIG. 4 based on a voltage V during electric conduction, each measured resistance and the measured point for each resistance value.

Figure 4:
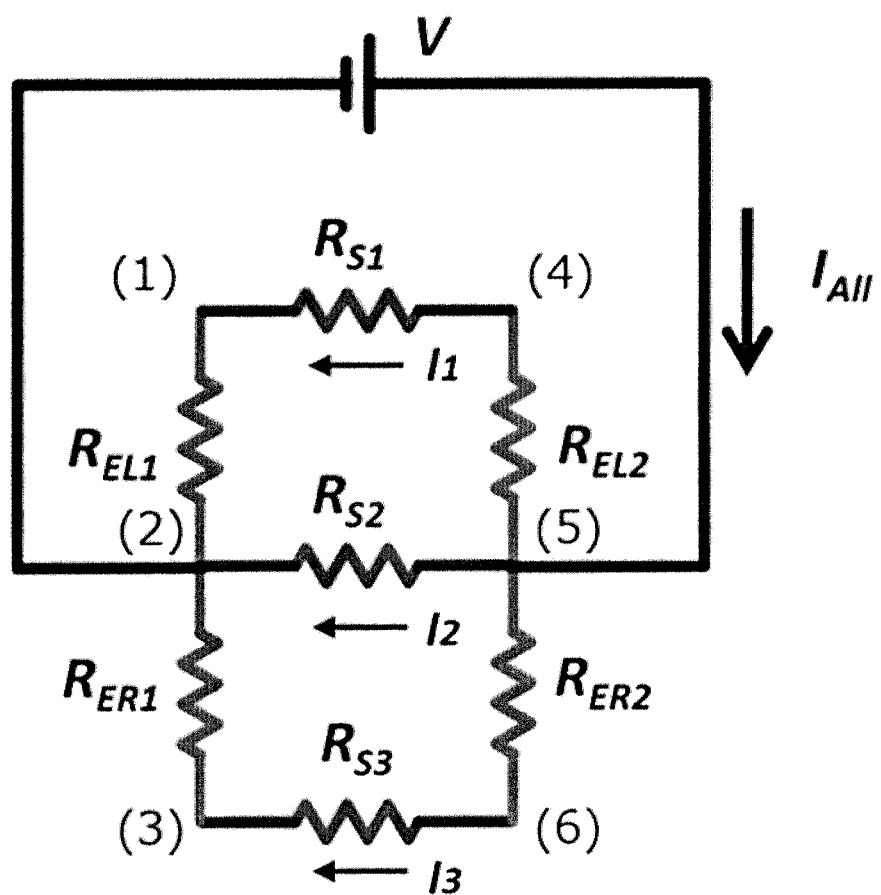
FIG. 4 shows a simplified resistance circuit created based on resistance values measured by the honeycomb structure in FIG. 3 and measured positions thereof.

How to estimate the resistance circuit as shown in FIG. 4 will be more specifically described. First, as shown in FIG. 3, on the surface of the outer peripheral wall 12 of the pillar shaped honeycomb structure portion 11 in the electrically conductive state, the resistance values $R_n$ between two different points are measured at a plurality of positions to obtain results as shown in Table 1.

TABLE 1

| Resistance Measurement Position in FIG. 3 (between Two Points) | Resistance Value $R_n$ between Two Points |
| --- | --- |
| Between (1) and (4) | $R_{s1}$ |
| Between (2) and (5) | $R_{s2}$ |
| Between (3) and (6) | $R_{s3}$ |
| Between (1) and (2) | $R_{EL1}$ |
| Between (2) and (3) | $R_{ER1}$ |
| Between (4) and (5) | $R_{EL2}$ |
| Between (5) and (6) | $R_{ER2}$ |

A parallel resistance circuit as shown in FIG. 4 assuming that it corresponds to the distribution of the internal resistance in the honeycomb structure 10 is assumed from the resistance measurement positions and the resistance values $R_n$ between the two points as shown in FIG. 3 and Table 1 as described above. In the resistance circuit as shown in FIG. 4, the current value $I_n$ flowing between the two points is estimated using Kirchhoff's law. That is, in the resistance circuit as shown in FIG. 4, the voltage during electric conduction is defined as V, and the total current flowing through the circuit is defined as a current value $I_{All}$, and the total current is divided into three paths and flows into three parallel resistance portions of "$R_{EL1}+R_{s1}+R_{EL2}$", "$R_{s2}$" and "$R_{ER1}+R_{s3}+R_{ER2}$". The currents divided into the three paths are a current passing through "$R_{EL1}+R_{s1}+R_{EL2}$" (current value $I_1$), a current passing through "$R_{s2}$" (current value $I_2$), and a current passing through "$R_{ER1}+R_{s3}+R_{ER2}$" (current value $I_3$), respectively. These voltages, current values, and resistance values have relationships as shown in the following equations (A) and (B), respectively:

$$V=(R_{EL1}+R_{s1}+R_{EL2})\times I_1=R_{s2}\times I_2=(R_{ER1}+R_{s3}+R_{ER2})\times I_3 \quad \text{Equation (A)}$$

$$I_{All}=I_1+I_2+I_3. \quad \text{Equation (B)}$$

Subsequently, in the honeycomb structure 10, the heat generation distribution in the honeycomb structure is estimated based on the position where each resistance value $R_n$ is measured and the heat value calculated from each resistance value $R_n$. Hereinafter, in the resistance circuit diagrams illustrated in FIGS. 3 and 4, the heat generation distribution in the honeycomb structure is estimated.

The total resistance R of the parallel resistance circuit 16 of the honeycomb structure 10 as shown in FIG. 3 satisfies the following relational expression (C):

$$1/R=1/(R_{EL1}+R_{s1}+R_{EL2})+1/R_{s2}+1/(R_{ER1}+R_{s3}+R_{ER2}). \quad \text{Equation (C)}$$

The equation (C) is transformed to obtain the following equations (D1) and (D2):

$$1/(R_{EL1}+R_{s1}+R_{EL2})=1/R-1/R_{s2}-1/(R_{ER1}+R_{s3}+R_{ER2})=\{R_{s2}\cdot(R_{ER1}+R_{s3}+R_{ER2})-R\cdot(R_{ER1}+R_{s3}+R_{ER2})-R\cdot R_{s2}\}/R\cdot R_{s2}\cdot(R_{ER1}+R_{s3}+R_{ER2}) \quad \text{Equation (D1)}$$

$$R_{EL1}+R_{s1}+R_{EL2}=R\cdot R_{s2}\cdot(R_{ER1}+R_{s3}+R_{ER2})/\{R_{s2}\cdot(R_{ER1}+R_{s3}+R_{ER2})-R\cdot(R_{ER1}+R_{s3}+R_{ER2})-R\cdot R_{s2}\}. \quad \text{Equation (D2)}$$

Further, since the current value $I_1$ flowing between (1) and (2) in FIG. 3 is $V/(R_{ER1}+R_{s3}+R_{ER2})$, the heat value $P_{E1}$ between (1) and (2) is represented by the following equation (E):

$$P_{ER1}=R_{ER1}\cdot I_1^2=R_{ER1}\cdot\{V/(R_{ER1}+R_{s3}+R_{ER2})\}^2 \quad \text{Equation (E)}$$

The heat value generated for each of the resistances between all two points can be thus calculated to estimate the heat generation distribution in the honeycomb structure 10. Therefore, when evaluating the heat generation distribution in the honeycomb structure, it is not necessary to actually generate heat in the honeycomb structure, and a measurement efficiency of the heat generation distribution of the honeycomb structure is improved. Further, since it is not necessary to evaluate the heat generation distribution in the honeycomb structure by confirming a temperature distribution with thermography, stable and accurate evaluation can be carried out without relying on human senses.

In the examples as described above, as shown in FIG. 3, two different points were selected from the six points as shown in the items (1) to (6) on the surface of the outer peripheral wall 12 of the pillar shaped honeycomb structure portion 11 in the electrically conductive state, and the resistance values $R_n$ between them were measured. Then, using the resistance values $R_n$, the resistance circuit as shown in FIG. 4 was assumed, and the heat generation distribution in the honeycomb structure 10 was measured based on that resistance circuit. However, the two different points at which the resistance values $R_n$ are measured are not limited thereto, and they can be freely selected. It is more preferable to select a large number of two different points at which the resistance values $R_n$ are measured uniformly and over a wide range on the surface of the outer peripheral wall 12 of the pillar shaped honeycomb structure portion 11 in the electrically conductive state. From such a viewpoint, the two different points at which the resistance values $R_n$ are measured are preferably selected at least from two points each spaced in the circumferential direction of the outer peripheral wall 12 of the pillar shaped honeycomb structure portion 11. Further, the two different points at which the resistance values $R_n$ are measured are preferably selected at least from two points each spaced in the extending direction of the cells 15 of the pillar shaped honeycomb structure 11. According to such a configuration, the resistance circuit in the honeycomb structure 10 can be more finely set, so that accuracy of the heat generation distribution measurement can be further improved.

<System for Measuring Heat Generation Distribution in Honeycomb Structure>

A system for measuring heat generation distribution in a honeycomb structure according to an embodiment of the present invention will be now described in detail. The system for measuring the heat generation distribution in the honeycomb structure according to the embodiment of the present invention is a system capable of implementing the method for measuring the heat generation distribution in the honeycomb structure according to the above embodiment of the present invention.

Figure 5:
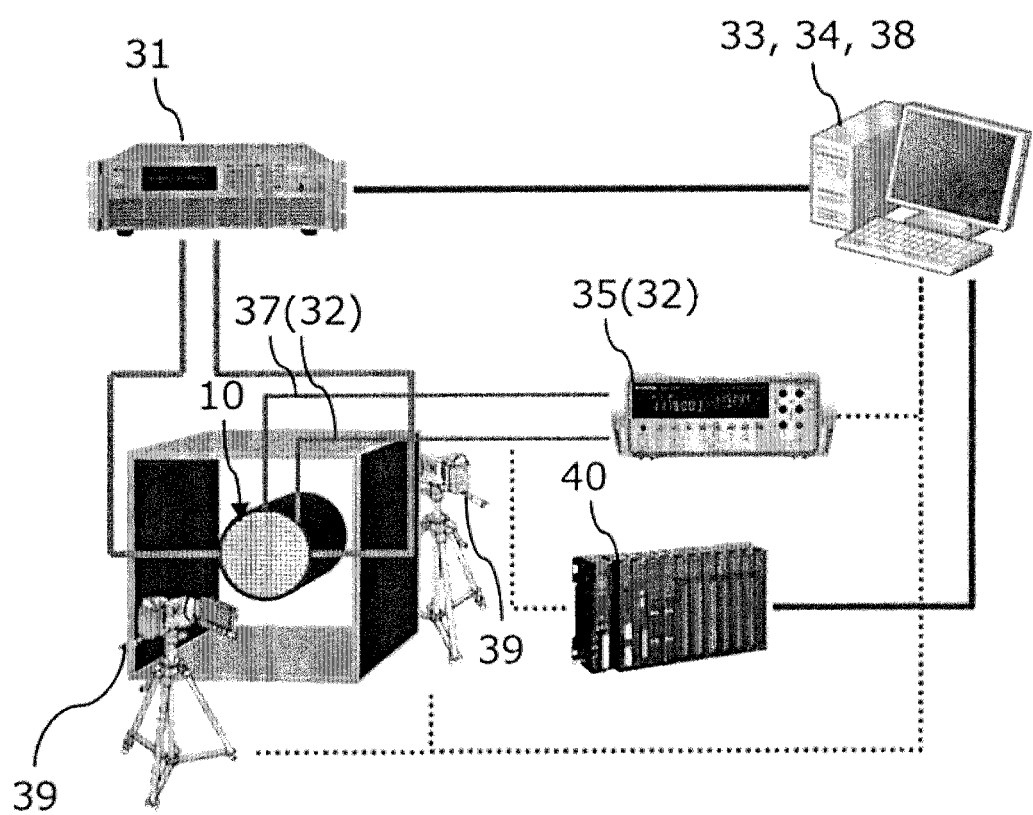
FIG. 5 is a schematic view of a system for measuring a heat generation distribution in a honeycomb structure according to an embodiment of the present invention.

FIG. 5 shows a schematic view of a system for measuring a heat generation distribution in the honeycomb structure 10 according to an embodiment of the present invention. The system for measuring the heat generation distribution in the honeycomb structure includes: a power supply unit 31 for applying a voltage to the pair of electrode layers 14a, 14b to bring the honeycomb structure 10 to an electrically conductive state. As the power supply unit 31, a DC power supply is used. It is preferable that the power supply unit 31 has a configuration capable of performing constant current control. The power supply unit 31 can turn on/off the power, adjust the voltage, and the like in accordance with a control signal from a control unit 38. The specification of the power supply unit 31 is not particularly limited. For example, when the pillar shaped honeycomb structure portion 11 of the honeycomb structure 10 has a circular pillar shaped honeycomb structure portion having a cross section with a diameter of from 80 to 120 mm and a length of from 50 to 120 mm, the power supply unit can be a 15 kW DC power supply at 600 V-25 A.

The system for measuring the heat generation distribution in the honeycomb structure includes: a resistance measurement unit 32 for measuring resistance values $R_n$ between two different points at a plurality of positions on the surface of the outer peripheral wall 12 of the pillar shaped honeycomb structure portion 11 in the electrically conductive state. The resistance measurement unit 32 can be comprised of a four-terminal probe 37 and a multimeter 35. That is, the resistance measurement unit 32 may press the four-terminal probe 37 against two different points on the surface of the outer peripheral wall 12 of the pillar shaped honeycomb structure portion 11, and measure the resistance values $R_n$ by the multimeter 35 connected to the four-terminal probe 37. The multimeter 35 is preferably capable of simultaneously measuring a plurality of, for example, 20 or more, resistance values $R_n$ between two different points obtained by simultaneously pressing a plurality of four-terminal probes 37.

Figure 6:
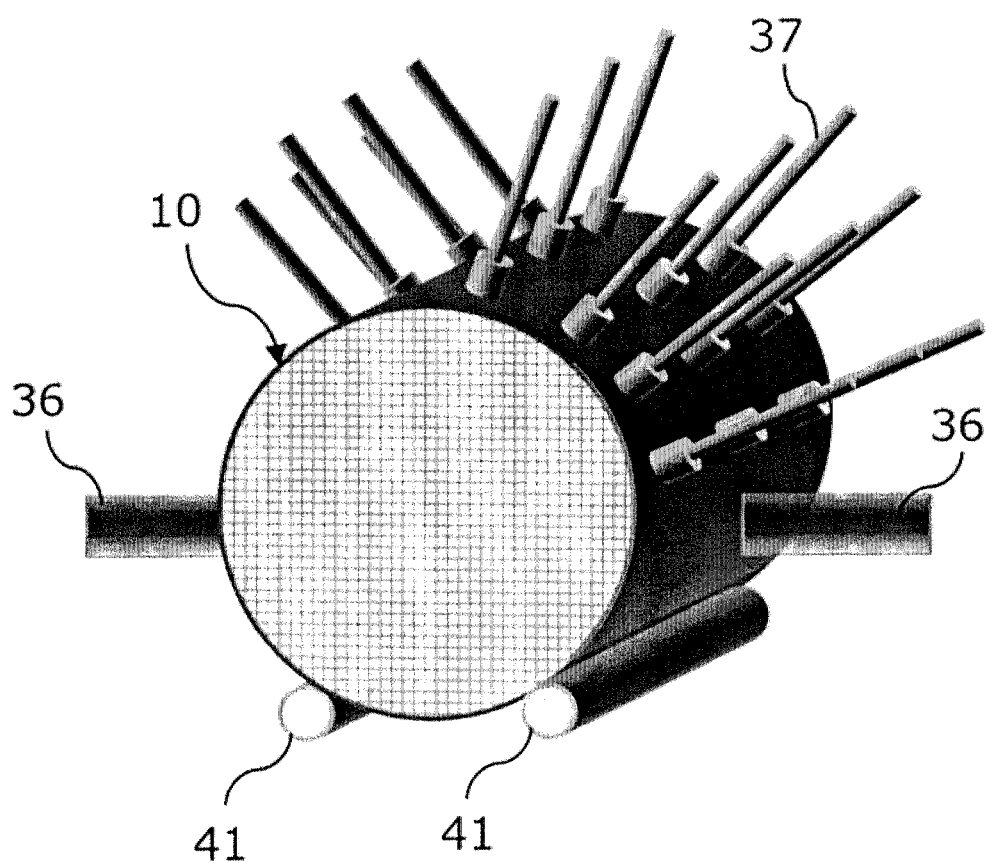
FIG. 6 is a schematic external view of a honeycomb structure supported by honeycomb structure rotating portions of a resistance measurement unit in a system for measuring a heat generation distribution in a honeycomb structure according to Embodiment of the present invention.

FIG. 6 is a schematic external view of the honeycomb structure 10 supported by honeycomb structure rotating portions 41 of the resistance measurement unit 32 in the system for measuring the heat generation distribution in the honeycomb structure 10 according to the embodiment of the present invention. In the example as shown in FIG. 6, 24 four-terminal probes 37 are pressed after selecting two points spaced along the circumferential direction of the outer peripheral wall 12 of the pillar shaped honeycomb structure portion 11, and selecting two points spaced along the extending direction of the cells of the pillar shaped honeycomb structure portion 11. Further, two current terminals 36 electrically connected from the power supply unit 31 are pressed against the electrode layers 14a, 14b on both side surfaces of the honeycomb structure 10, respectively, so that the electrically conductive state is maintained.

The four-terminal probe 37 may be controlled by a PLC (Programmable Logic Controller) 40 so as to be automatically and continuously pressed against certain positions of the honeycomb structure 10 one after another. The PLC 40 can be controlled by the control unit 38.

The honeycomb structure 10 as shown in FIG. 6 is supported by two pillar shaped honeycomb structure rotating portions 41 of the resistance measurement unit 32, and the two pillar shaped honeycomb structure rotating portions 41 are rotated by a certain angle in the same direction, so that the honeycomb structure 10 can be rotated around the central axis of the honeycomb structure 10. According to such a configuration, the honeycomb structure 10 can be rotated, for example, by 180 degrees without changing the positions of the four-terminal probes 37, and the resistances can be measured on two side surfaces with the central axis of the honeycomb structure 10 as a symmetrical axis. Therefore, the resistance measurement efficiency of the honeycomb structure 10 is improved.

During the electrical conduction of the honeycomb structure 10, a thermoviewer 39 for observing one end face and the other end face of the honeycomb structure 10 may be provided. By observing the end faces of the honeycomb structure 10 during electrical conduction with the thermoviewer 39, the presence or absence of a defect generated inside the honeycomb structure 10 can be confirmed. Data obtained by the thermoviewer 39 may be collected and analyzed by the control unit 38.

The system for measuring the heat generation distribution in the honeycomb structure according to the embodiment of the present invention includes: a heat value calculation unit 33 and a heat generation distribution estimation unit 34. The heat value calculation unit 33 estimates a current value $I_n$ flowing between the two points using Kirchhoff's law based on the resistance values $R_n$ between the two different points measured at a plurality of positions by the resistance measurement unit 32, and calculates a heat value generated for each resistance value $R_n$ based on each resistance value $R_n$ and the current value $I_n$. The heat generation distribution estimation unit 34 estimates the heat generation distribution in the honeycomb structure 10 based on a portion where each resistance value $R_n$ is measured and the heat value calculated from each resistance value $R_n$ in the honeycomb structure 10. The calculation of the heat value generated for each resistance value $R_n$ by the heat value calculation unit 33 and the estimation of the heat generation distribution in the honeycomb structure 10 by the heat generation distribution estimation unit 34 are as described in the method for measuring the heat generation distribution in the honeycomb structure as described above. The heat generation distribution estimation unit 34 may also serve as the heat value calculation unit 33. Furthermore, the heat generation distribution estimation unit 34 and the heat value calculation unit 33 may also serve as the control unit 38. That is, the heat generation distribution estimation unit 34, the heat value calculation unit 33, and the control unit 38 may be composed of one computer.

<Method for Producing Honeycomb Structure>

In a method for producing a honeycomb structure according to an embodiment of the present invention, first, the heat generation distribution in the honeycomb structure 10 is measured by the method for measuring the heat generation distribution in the honeycomb structure according to the embodiment of the present invention as described above.

The measured heat generation distribution in the honeycomb structure 10 is then evaluated, and passed products are selected. Criteria for selecting passed products can be appropriately set based on the heat generation distribution required for the honeycomb structure 10. For example, the selection criteria are set such that the heat value generated for each resistance between two points is equal to or less than a certain threshold so as to satisfy that the temperature distribution in the honeycomb structure 10 after electric conduction at 400 V for 20 seconds in a windless state is 200° C. or less, and a variation in the heat value generated at each position can be within a certain range.

According to the method for producing the honeycomb structure according to the embodiment of the present invention, the heat generation distribution is measured as described above, certain selection criteria are provided, and a honeycomb structure selected as a passed product is obtained, so that the heat generation distribution can be efficiently measured, and a honeycomb structure selected based on stable and accurate evaluation can be obtained.

<Method for Producing Electrically Heated Carrier>

(1. Electric Heating Type Support)

Figure 7:
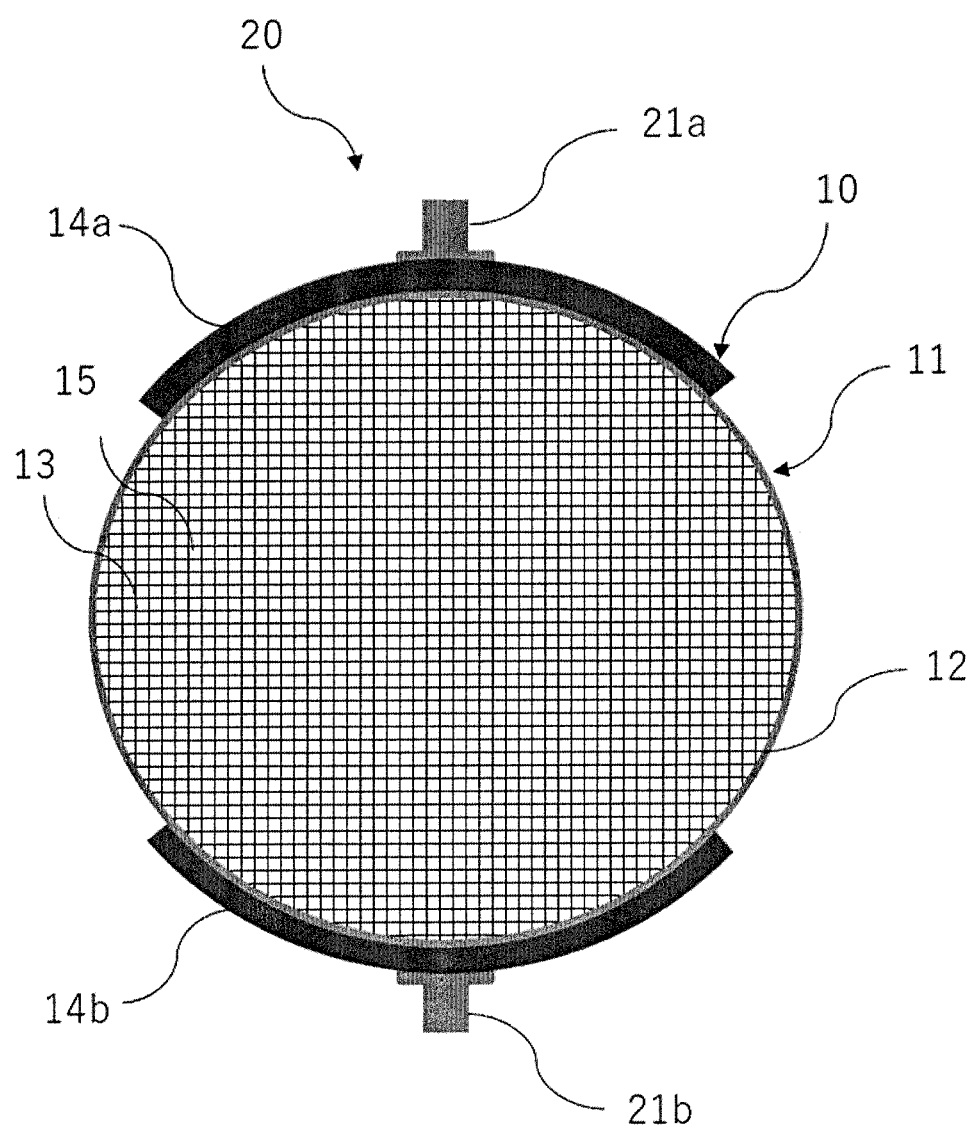
FIG. 7 is a schematic cross-sectional view of an electric heating type support according to an embodiment of the present invention, which is perpendicular to a cell extending direction.

FIG. 7 is a schematic cross-sectional view of the electric heating type support 20 according to an embodiment of the present invention, which is perpendicular to the cell extending direction. The electric heating type support 20 includes the honeycomb structure 10 and a pair of metal terminals 21a, 21b.

(2. Metal Terminal)

The pair of metal terminals 21a, 21b are disposed so as to face each other across the central axis of the pillar shaped honeycomb structure portion 11 of the honeycomb structure 10, and are provided on the pair of electrode layers 14a, 14b, respectively, and are electrically connected. Accordingly, as a voltage is applied to the metal terminals 21a, 21b through the electrode layers 14a, 14b, then the electricity is conducted through the metal terminals 21a, 21b to allow the honeycomb structure 10 to generate heat by Joule heat.

The material of the metal terminals 21a, 21b is not particularly limited as long as it is a metal, and a single metal, an alloy, or the like can be employed. In terms of corrosion resistance, electrical resistivity and linear expansion coefficient, for example, the material is preferably an alloy containing at least one selected from the group consisting of Cr, Fe, Co, Ni and Ti, and more preferably stainless steel and Fe—Ni alloys. The shape and size of each of the metal terminals 21a, 21b are not particularly limited, and they can be appropriately designed according to the size of the electric heating type support 20, the electrical conduction performance, and the like.

By supporting the catalyst on the electric heating type support 20, the electric heating type support 20 can be used as a catalyst. For example, a fluid such as an exhaust gas from a motor vehicle can flow through the flow paths of the plurality of cells 15. Examples of the catalyst include noble metal catalysts or catalysts other than them. Illustrative examples of the noble metal catalysts include a three-way catalyst and an oxidation catalyst obtained by supporting a noble metal such as platinum (Pt), palladium (Pd) and rhodium (Rh) on surfaces of pores of alumina and containing a co-catalyst such as ceria and zirconia, or a lean nitrogen oxides trap catalyst (LNT catalyst) containing an alkaline earth metal and platinum as storage components for nitrogen oxides ($NO_x$). Illustrative examples of a catalyst that does not use the noble metal include a NOx selective catalytic reduction catalyst (SCR catalyst) containing a copper-substituted or iron-substituted zeolite, and the like. Further, two or more catalysts selected from the group consisting of those catalysts may be used. A method for supporting the catalyst is not particularly limited, and it can be carried out according to a conventional method for supporting the catalyst on the honeycomb structure.

(3. Method for Producing Electric Heating Type Support)

In a method for producing an electric heating type support according to an embodiment of the present invention, first, the heat generation distribution in the honeycomb structure 10 is measured by the method for measuring the heat generation distribution in the honeycomb structure according to the embodiment of the present invention as described above.

The measured heat generation distribution in the honeycomb structure 10 is then evaluated, and passed products are selected. The criteria for selecting passed products can be appropriately set based on the heat generation distribution required for the honeycomb structure 10. For example, as the selection criteria, the selection criteria for the passed products as described above in the method for producing the honeycomb structure can be used.

A pair of metal terminals 21a, 21b can be then provided on the pair of electrode layers 14a, 14b by welding, thermal spraying, or the like to the honeycomb structure 10 selected as a passed product, thereby producing the electric heating type support 20.

According to the method for producing the electric heating type support according to the embodiment of the present invention, a honeycomb structure that has been subjected to the heat generation distribution measurement as described above, provided with certain selection criteria, and selected as a passed product can be obtained. Therefore, the heat generation distribution can be efficiently measured, and a honeycomb structure selected based on the stable and accurate evaluation can be obtained. Further, it is possible to produce an electric heating type support using the honeycomb structure that has been selected based on the stable and accurate evaluation.

DESCRIPTION OF REFERENCE NUMERALS 10 honeycomb structure
11 pillar shape honeycomb structure
12 outer peripheral wall
13 partition wall
14a, 14b, electrode layer
15 cell
21a, 21b, metal terminal
31 power supply unit
32 resistance measurement unit
33 heat value calculation unit
34 heat generation distribution estimation unit
35 multimeter
36 current terminal 37 four-terminal probe
38 control unit
30 thermoviewer
40 PLC
41 honeycomb structure rotating portion

The invention claimed is:

1. A method for measuring a heat generation distribution in a honeycomb structure using a resistance measurement unit comprising two current terminals that are electrically connected to a power supply unit; and a multimeter connected to at least one four-terminal probe, which are for measuring a plurality of resistance values; the honeycomb structure comprising:
  a pillar shaped honeycomb structure portion comprising:
    an outer peripheral wall; and porous partition walls disposed on an inner side of the outer peripheral wall, the porous partition walls defining a plurality of cells, each cell penetrating from one end face to other end face to form a flow path; and
  a pair of electrode layers disposed on a surface of the outer peripheral wall of the pillar shaped honeycomb structure portion so as to face each other across a central axis of the pillar shaped honeycomb structure portion,
  the method comprising the steps of:
    pressing the at least one four-terminal probe against the surface of the outer peripheral wall of the pillar shaped honeycomb structure portion;
    pressing the current terminals against the pair of electrode layers;
    applying, via the current terminals, a voltage to the pair of electrode layers to bring the honeycomb structure to an electrically conductive state;
    measuring, via the multimeter connected to the at least one four-terminal probe, resistance values $R_n$ between two different points at a plurality of positions on the surface of the outer peripheral wall of the pillar shaped honeycomb structure in the electrically conductive state;
    estimating a current value $I_n$ flowing between the two points using Kirchhoff's law based on each of the resistance values $R_n$ between the two different points measured at the plurality of positions, and calculating a heat value generated for each of the resistance values $R_n$ based on each of the resistance values $R_n$ and the current value $I_n$; and
    estimating a heat generation distribution in the honeycomb structure based on both the positions at which each of the resistance values $R_n$ is measured, and the heat value calculated from each of the resistance values $R_n$, in the honeycomb structure.

2. The method for measuring the heat generation distribution in the honeycomb structure according to claim 1, wherein the two different points at which each of the resistance values $R_n$ is measured are selected at least from two points each spaced in a circumferential direction of the outer peripheral wall of the pillar shaped honeycomb structure.

3. The method for measuring the heat generation distribution in the honeycomb structure according to claim 1, wherein the two different points at which each of the resistance values $R_n$ is measured are selected at least from two points each spaced in an extending direction of the cells of the pillar shaped honeycomb structure.

4. A system for measuring a heat generation distribution in a honeycomb structure, the honeycomb structure comprising:
  a pillar shaped honeycomb structure portion comprising:
    an outer peripheral wall; and porous partition walls disposed on an inner side of the outer peripheral wall, the porous partition walls defining a plurality of cells, each cell penetrating from one end face to other end face to form a flow path; and
  a pair of electrode layers disposed on a surface of the outer peripheral wall of the pillar shaped honeycomb structure portion so as to face each other across a central axis of the pillar shaped honeycomb structure portion,
  the system comprising:
    a power supply unit for applying a voltage to the pair of electrode layers to bring the honeycomb structure to an electrically conductive state;
    a resistance measurement unit comprising two current terminals, which are electrically connected to the power supply unit, for pressing against the pair of electrode layers to apply the voltage from the power supply unit to the pair of electrode layers; and a multimeter connected to at least one four-terminal probe, which are measuring a plurality of resistance values, and the at least one four-terminal probe is for pressing against the surface of the outer peripheral wall of the pillar shaped honeycomb structure portion for measuring resistance values $R_n$ between two different points at a plurality of positions on the surface of the outer peripheral wall of the pillar shaped honeycomb structure in the electrically conductive state;
    a heat value calculation unit for estimating a current value $I_n$ flowing between the two points using Kirchhoff's law based on each of the resistance values $R_n$ between the two different points measured at the plurality of positions, and calculating a heat value generated for each of the resistance values $R_n$ based on each of the resistance values $R_n$ and the current value $I_n$; and
    a heat generation distribution estimation unit for estimating a heat generation distribution in the honeycomb structure based on both the positions at which each of the resistance values $R_n$ is measured, and the heat value calculated from each of the resistance values $R_n$, in the honeycomb structure.

5. The system for measuring the heat generation distribution according to claim 4, wherein the heat generation distribution estimation unit also serves as the heat value calculation unit.

6. The system for measuring the heat generation distribution according to claim 4, wherein the resistance measurement unit further comprises at least one honeycomb structure rotating portion for rotating the honeycomb structure around a central axis of the honeycomb structure.

7. The system for measuring the heat generation distribution in the honeycomb structure according to claim 4, wherein the two different points at which each of the resistance values $R_n$ is measured are selected at least from two points each spaced in a circumferential direction of the outer peripheral wall of the pillar shaped honeycomb structure.

8. The system for measuring the heat generation distribution in the honeycomb structure according to claim 1, wherein the two different points at which each of the resistance values $R_n$ is measured are selected at least from two points each spaced in an extending direction of the cells of the pillar shaped honeycomb structure.

9. A method for producing a honeycomb structure, the method comprising the steps of:
   measuring a heat generation distribution in the honeycomb structure by the method for measuring the heat generation distribution in the honeycomb structure according to claim 1; and
   evaluating the heat generation distribution in the honeycomb structure and selecting a passed product.

10. A method for producing an electric heating type support, the method comprising the steps of:
    measuring a heat generation distribution in the honeycomb structure by the method for measuring the heat generation distribution in the honeycomb structure according to claim 1;
    evaluating the heat generation distribution of the honeycomb structure and selecting a passed product; and
    providing a pair of metal terminals on the pair of electrode layers to the selected honeycomb structure.

11. The system for measuring the heat generation distribution according to claim 5, wherein the resistance measurement unit further comprises at least one honeycomb structure rotating portion for rotating the honeycomb structure around a central axis of the honeycomb structure.

* * * * *